United States Patent [19]

Maung et al.

[11] Patent Number: 5,503,707
[45] Date of Patent: Apr. 2, 1996

[54] METHOD AND APPARATUS FOR PROCESS ENDPOINT PREDICTION BASED ON ACTUAL THICKNESS MEASUREMENTS

[75] Inventors: Sonny Maung; Stephanie W. Butler; Steven A. Henck, all of Plano, Tex.

[73] Assignee: Texas Instruments Incorporated, Dallas, Tex.

[21] Appl. No.: 125,954

[22] Filed: Sep. 22, 1993

[51] Int. Cl.$^6$ ................................................. H01L 21/306
[52] U.S. Cl. .................... 156/626.1; 156/627.1; 156/643.1; 427/10
[58] Field of Search .................... 156/626, 627, 156/643.1; 427/10; 356/369, 366, 367, 368, 381, 382

[56] References Cited

U.S. PATENT DOCUMENTS

| | | | |
|---|---|---|---|
| 4,198,261 | 4/1980 | Busta | 156/626 |
| 5,131,752 | 7/1992 | Yu | 356/369 |
| 5,160,576 | 11/1992 | Robbins | 156/626 |
| 5,270,222 | 12/1993 | Moslehi | 437/8 |

OTHER PUBLICATIONS

Sweet, A. L., "Using coupled EWMA control charts for monitoring processes with linear trends", IIE Trans., vol. 20, No. 4, pp. 404–408, 1988.

Wright, D. J., "Forecasting data published at irregular time intervals using an extension of Holt's method", Manage. Sci., vol. 32, No. 4, pp. 499–510, 1986.

*Primary Examiner*—R. Bruce Breneman
*Assistant Examiner*—Joni Y. Chang
*Attorney, Agent, or Firm*—John D. Crane; James C. Kesterson; Richard L. Donaldson

[57] ABSTRACT

In accordance with one aspect of the present invention, a method is provided for predicting the endpoint time of a semiconductor process for a layer of a wafer (14). The endpoint time is the time at which a predetermined thickness of the layer occurs. A layer thickness, calculated for a first sample time, is received. It is then determined whether or not the layer thickness lies within a predetermined range. If the layer thickness does lie within the predetermined range, it is used to update a forecasted process rate. The forecasted process rate is used to predict the endpoint time. The endpoint time is used to control the semiconductor process so that the layer of wafer (14) is formed having the predetermined thickness.

24 Claims, 5 Drawing Sheets

FIG. 2a
ETCH RATE Vs TIME

FIG. 2b
LAYER THICKNESS Vs TIME

FIG. 2c
GROWTH RATE Vs TIME

FIG. 2d
LAYER THICKNESS Vs TIME

METHOD AND APPARATUS FOR PROCESS ENDPOINT PREDICTION BASED ON ACTUAL THICKNESS MEASUREMENTS

TECHNICAL FIELD OF THE INVENTION

This invention relates generally to the field of electronic systems and more specifically to a system for predicting the endpoint time of a semiconductor wafer process.

BACKGROUND OF THE INVENTION

Many low-volume semiconductor wafers are fabricated in a single-wafer process. The fabrication process, to be profitable, must yield a certain percentage of useable wafers. In order to form a useable wafer, a process controller typically stops the process between each wafer layer when the layer under process, i.e., the active layer, which is typically the top most layer, has attained its desired thickness. The time at which a layer attains its desired thickness is the process stop point, i.e., the endpoint time for that layer. For wafers produced in a conventional process, statistical data is collected from trial runs, and this data provides the optimum process endpoint times for each layer. However, performing trial runs to collect data does not optimize the potential benefits of a single-wafer process. Therefore, semiconductor manufacturers must use other methods of predicting the process endpoint time for layers of a wafer fabricated in a single-wafer process.

Monitoring the wafer layer thickness in real time is one method used to predict the endpoint time. Typical layer-thickness monitoring systems may include a sensor, such as an interferometer. An interferometer is a device which uses waves of electromagnetic energy to obtain certain kinds of data. In layer-thickness monitoring applications, the interferometer transmits these waves toward the wafer and the wafer reflects these waves back to the interferometer. During the reflection process, the wafer layers change certain parameters of the waves, such as phase and amplitude. The type and quantity of these changes are related to the thicknesses and refractive indices of the wafer layers.

These parameter changes are processed and compared with values in a look-up table (LUT). Each value in the LUT was previously and empirically derived to correspond with a certain layer thickness. The thicknesses of the wafer layers, hereinafter the "layer thicknesses", are determined to be the values corresponding to the LUT parameter changes closest to the actual parameter changes.

The interferometer system generates from the LUT samples of the layer thicknesses at discrete time intervals. These samples are mathematically manipulated by a processor using various techniques to calculate and update a process rate, i.e., the actual rate at which the thickness of the active layer is changing. ("Updating" refers to recalculating, i.e., adjusting, the process rate each time layer thickness samples are generated.) Once the process rate is updated, the time at which the endpoint occurs for the active layer can be predicted. The processor then signals the controller to stop the process at this predicted time.

One problem with typical endpoint detection methods and systems is that the proper pre-process placement of the wafer within the processing chamber cannot be confirmed. If the wafer is not properly placed within the chamber, the electromagnetic waves from the sensor will not properly strike the wafer, and the thickness monitoring system will generate erroneous layer thickness samples.

Another problem with typical endpoint detection methods and systems is that improper processing of the previous layers cannot be detected. Thus, the current process cannot be aborted to prevent further processing of a defective wafer.

Yet another problem with typical endpoint detection methods and systems is that distortion of the transmitted or reflected waves cannot be detected. Typically, these waves enter and exit the process chamber through chamber windows. Deposits of process materials which accumulate on these windows may distort the transmitted or reflected waves. This distortion may cause parameter measurement errors which may ultimately lead to erroneous thickness samples.

Another problem with typical endpoint detection systems is that a layer thickness sample, which is out of an expected range, cannot be detected. (A faulty interferometer or rough layer surface may cause the out-of-range sample.)

Still another problem with typical endpoint prediction systems is that the calculation techniques used cannot account for trends of deviation from the ideal process rate exhibited by the actual process rate.

Out-of-range wafer thickness samples and non-accounting for trends of deviation can cause an erroneous endpoint time prediction. If this erroneous prediction is severe enough, the wafer will not meet predetermined performance standards and tolerances, and the process yield will be reduced.

SUMMARY OF THE INVENTION

In accordance with one aspect of the present invention, a method is provided for predicting the endpoint time of a semiconductor process for a target layer of a wafer containing one or more layers. The endpoint time is the time at which a predetermined thickness of the target layer occurs. A layer thickness of the target layer, calculated for a first time sample, is received. It is then determined whether the layer thickness lies within a predetermined range. If the layer thickness does lie within the predetermined range, it is used to update a forecasted process rate. The forecasted process rate is used to predict the endpoint time. The endpoint time is used to control the semiconductor process so that the target layer of the wafer is formed having the predetermined thickness.

A technical advantage provided by one aspect of the invention is that the accuracy of wafer placement can be determined prior to the start of the process. This provides an opportunity to correct the wafer placement before the process start, and increases the probability that the wafer will be processed within tolerance levels.

Another technical advantage provided by another aspect of the present invention is that improper processing of the previous layers can be detected. Thus, the current process can be aborted to prevent further processing of a defective wafer.

Yet another technical advantage provided by yet another aspect of the present invention is that distortion of the transmitted or reflected waves can be detected.

Another technical advantage provided by another aspect of the present invention is that an out-of-range, i.e., invalid, thickness measurement of the active layer will be detected. Updating of the actual process rate is performed using only these valid thickness measurements. Thus, an erroneous thickness measurement will not corrupt the updating of the actual process rate.

Still another technical advantage provided by still another aspect of the present invention is that trends of deviation from the ideal process rate are accurately accounted for in the updating of the actual process rate.

BRIEF DESCRIPTION OF THE DRAWINGS

For a more complete understanding of the present invention, and the advantages thereof, reference is now made to the following descriptions taken in, conjunction with the accompanying drawings, in which:

FIG. 1 is a system for implementing a single-wafer process;

FIG. 2a is a graph of a constant etch rate versus time;

FIG. 2b is a graph of layer thickness versus time for the etch rate of FIG. 2a;

FIG. 3 is a flow chart illustrating the six most significant states of the endpoint detection algorithm executed by the endpoint detector of FIG. 1;

DETAILED DESCRIPTION OF THE INVENTION

The preferred embodiment of the present invention and its advantages are best understood by referring to the FIGS. 1–12 wherein like numerals refer to like and corresponding parts of the various drawings.

Figures 1, 2A, 2B, 3:
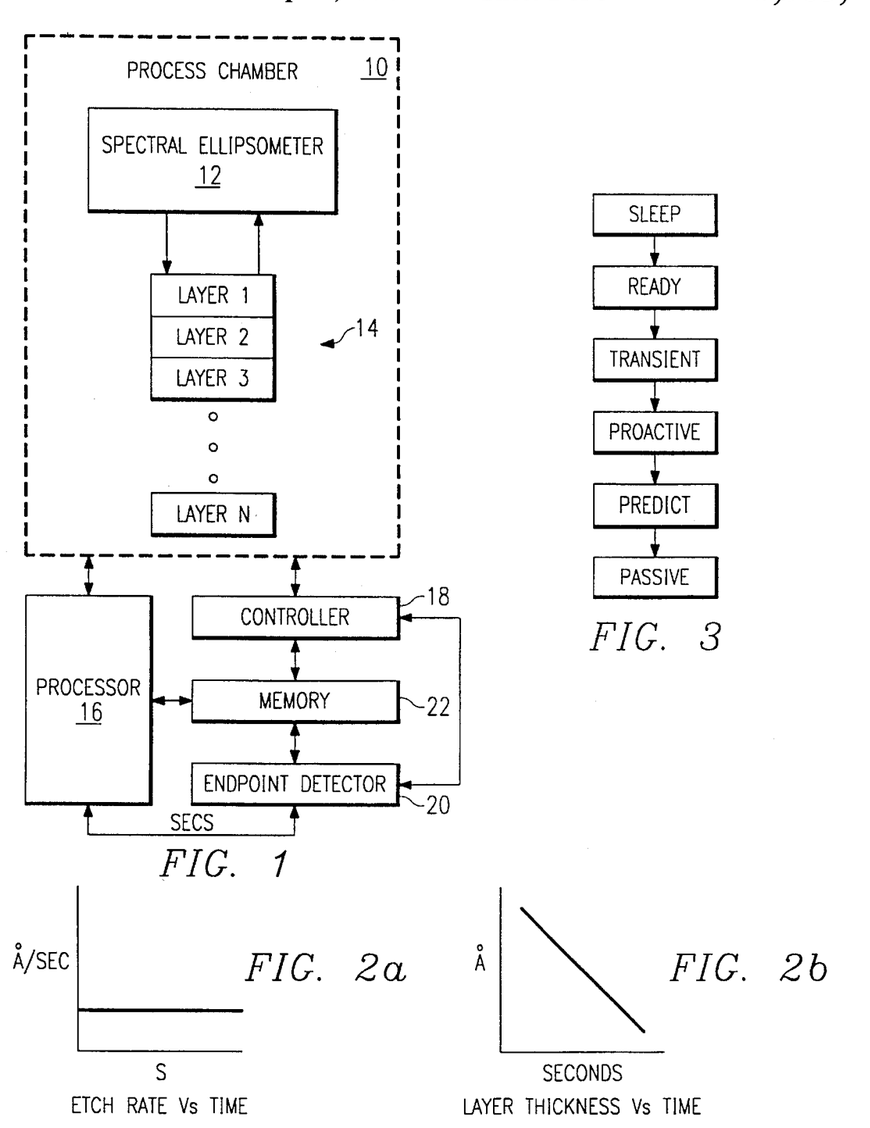

FIG. 1 shows a wafer process chamber 10 having therein a spectral ellipsometer 12 and a wafer 14 having N layers. It is understood that if wafer 14 is to undergo an etching process, layers 1–N are present at the beginning of the process and will be etched away in varying degrees depending upon the process. Conversely, if wafer 14 is subjected to a growth process, layers 1–N will be deposited during the process beginning with layer N, the bottom most layer and ending with layer 1, the top most layer. The wafer thickness at a particular time is the summation of the thickness of the layers present at this particular time. Typically, only the thickness of a target, i.e., active layer (which is the top most layer in most cases) is used to update a forecasted process rate as will be explained below.

Still referring to FIG. 1, a processor 16 is coupled to chamber 10 and receives raw data from ellipsometer 12. A process controller 18 is coupled between chamber 10 and an endpoint detector 20. Controller 18 controls the process within chamber 10 in response to signals received from both endpoint detector 20 and other sources (not shown). Such signals from detector 20 typically include the time at which the process should be stopped for the active layer. Endpoint detector 20 and processor 16 use the Semiconductor Equipment Communication Standard (SECS) protocol to communicate with one another.

Endpoint detector 20 is coupled to processor 16 for receiving layer thicknesses and FOM data as discussed below. In one embodiment, detector 20 is a processor executing an endpoint detection algorithm. In other embodiments, the functions of detector 20 may be performed by processor 16.

Spectral ellipsometer 12 is a specific type of sensor which generates and transmits a signal toward wafer 14. The transmitted, i.e., source, signal, has certain parameters, including but not limited to an amplitude and a phase. The source signal strikes the layers of wafer 14 and is reflected back to spectral ellipsometer 12 as a reflected signal. The reflected signal has the same parameters as the source signal. However, the values of these parameters differ from the values of the source signal parameters. These differences in the parameter values, i.e., raw data, are mathematically related to the thicknesses and optical properties, i.e., refractive indices of the layers of wafer 14. Processor 16 calculates the actual thickness of each layer at a specific sample time from raw data measured at this sample time.

Although one aspect of the present invention is discussed with reference to spectral ellipsometer 12, other types of sensors may be used. In fact, any device may be used which can provide actual real time raw data measured at discrete sample times for processor 16 to calculate the layer thicknesses at these discrete sample times.

In operation, spectral ellipsometer 12 emits polarized light waves. These waves are directed toward wafer 14 and reflected back to spectral ellipsometer 12. Ellipsometer 12 sends parameters of these reflected waves, i.e., raw data, to processor 16 for analysis. Ellipsometer 12 also sends a time stamp to processor 16. The time stamp, i.e., sample time, is the approximate center of the time duration during which the raw data is measured. An example of an ellipsometer used for endpoint detection is found in U.S. patent application Ser. No. 07/882,779, entitled "Method for Rapidly Etching Material on a Semiconductor Device," filed May 14, 1992, Examiner G. Goudreau, Art Unit 114, inventor Steven A. Henck, assigned to Texas Instruments, Inc., Dallas, Tex., which is hereby incorporated by reference herein for all purposes.

Processor 16 implements an algorithm for determining, in real time from the raw data, parameters $\psi$ and $\Delta$ (intermediate parameters needed to determine the FOM), the layer thicknesses and the FOM at the sample time given by the time stamp. No LUTS are required. This algorithm and a spectral ellipsometer which provides the raw data required by this algorithm are disclosed in patent application Ser. No. 07/890,511, entitled "Phase Modulated Spectral Ellipsometer System and Method," filed May 28, 1992, Examiner M. Cano, Art Unit 189, inventors Walter M. Duncan, Steven A. Henck, Douglas L. Mahlum, and Larry A. Taylor, assigned to Texas Instruments, Inc., Dallas, Tex., which is hereby incorporated by reference herein for all purposes.

After calculating the actual layer thicknesses and the FOM, processor 16 feeds these values to endpoint detector 20. Detector 20 executes a "Robust Endpoint Detection Algorithm" which uses the actual thickness measurement of the active layer to predict when the wafer process should be stopped in order that the active layer be etched or grown to the desired thickness. Detector 20 can control the thickness of each layer because it can predict the actual thickness of each layer when it is under process, as is discussed below. Detector 20 signals controller 18 to change or cease the process within chamber 10 at the appropriate time to produce the desired layer thickness of the active layer.

Figure 2C:
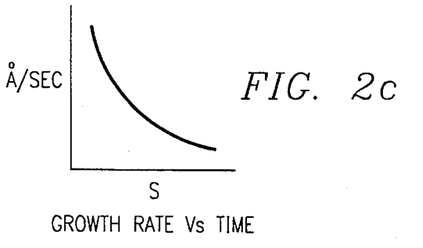
FIG. 2c is a graph of a nonlinear growth rate versus time.
Figure 2D:
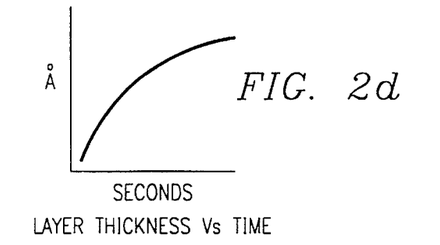
FIG. 2d is a graph of layer thickness versus time for the nonlinear growth rate of FIG. 2c.

Referring to FIGS. 2A and 2B, a graph of a etch rate versus time with a corresponding graph of layer thickness versus time is shown. FIGS. 2C and 2D are a graph of growth rate versus time with a corresponding graph of layer thickness versus time. These etch rate and growth rate graphs show examples of an ideal etch rate and growth rate for a particular process. However, the actual process rates may vary slightly from these ideal rates. This variation is known as the trend which the process exhibits. The endpoint algorithm which endpoint detector 20 implements takes into account both the ideal rate and the trend to predict the thickness of the active layer at a particular time. The real time actual thickness measurements of the active layer provided by processor 16 allow detector 20 to incorporate the process trend into its calculations.

In one aspect of the invention, endpoint detector 20 can determine the validity of a thickness measurement by comparing the actual measurement to a predicted measurement. The actual measurement is determined erroneous if it differs from the predicted measurement by a threshold value of the normalized residual (nr).

In another aspect of the invention, a raw process rate is calculated and compared to maximum and minimum process rate thresholds MAXRATE and MINRATE (TABLE 1). If the raw process rate is outside of this max/min window, the thickness sample is invalid.

In still another aspect of the invention, the validity of a thickness sample of the active layer is determined by comparing a figure of merit (FOM) with an acceptable figure of merit (AFOM). The FOM is generated by spectral ellipsometer 12 at each time stamp. The AFOM is a known value preloaded into detector 20. If the FOM is greater than the AFOM, the thickness sample is invalid. Because the FOM is a real time value not available in the prior art, its generation and use provide a significant advantage over the prior art. The FOM can also be analyzed before processing begins to see if the previous wafer layers have been properly processed, if wafer 14 is properly positioned within chamber 10, and if the optics windows of chamber 10 are not distorting the spectral ellipsometer 12 light beam.

In yet another aspect of the invention, the FOM technique is combined with either the actual/predicted measurement and/or the raw rate technique into a two prong test. If the thickness sample passes the first prong, i.e. the FOM prong, it still must pass the second prong before it is considered valid.

Detector 20 will not incorporate any erroneous thickness measurements into its calculations. Instead, detector 20 only incorporates valid measurements into its calculations. Thus, detector 20 may still yield a sufficiently accurate endpoint prediction even where a large number of invalid thickness measurements are received, such as might occur when either spectral ellipsometer 12 or processor 16 fails in the midst of a process.

In a further aspect of the invention, detector 20, by determining the validity of the thickness samples, can detect distortion caused by dirty windows of chamber 10.

Referring to FIG. 3, a flow chart illustrates the six most significant states of the endpoint detection algorithm executed by endpoint detector 20. These include the SLEEP, READY, TRANSIENT, PROACTIVE, PREDICT and PASSIVE states.

During the SLEEP state, endpoint detector 20 is loaded with parameter values from controller 18. These parameter values are specific to the particular process to be performed. These parameters and their descriptions are listed in TABLE 1. The SLEEP state is discussed in more detail in conjunction with FIG. 4.

During the READY state, which is discussed in detail below in conjunction with FIG. 5, endpoint detector 20 checks the FOM. Detector 20 compares the FOM to the loaded AFOM data to determine whether or not wafer 14 is properly positioned in chamber 10. Wafer 14 must be properly aligned with ellipsometer 12 in order that spectral ellipsometer 12 may properly receive the reflected light waves. If detector 20 determines that wafer 14 is not properly positioned, it can send a signal to processor 16 to order the process stopped before it is even started. In this way, the formation of a defective wafer due to erroneous thickness measurements is prevented. Endpoint detector 20 further analyzes the FOM with respect to the FILM STACK MODEL (TABLE 1) to determine if existing layers of wafer 14 have been processed from the correct material and to the correct thickness. If any of the existing layers have been incorrectly processed, endpoint detector 20 signals controller 18 to abort the process. This process abortion saves time and processing resources by halting further processing of a defective wafer.

The TRANSIENT state is active during the time when the processing gases are first allowed to flow into process chamber 10. Various transient reflections will be received by spectral ellipsometer 12 and processed by processor 16. The FOM which processor 16 sends to endpoint detector 20 is evaluated and compared to the AFOM. If the FOM is greater than the AFOM, detector 20 signals controller 18 to abort processing. The TRANSIENT state is discussed in detail below in conjunction with FIG. 6.

Figures 7A, 7B:
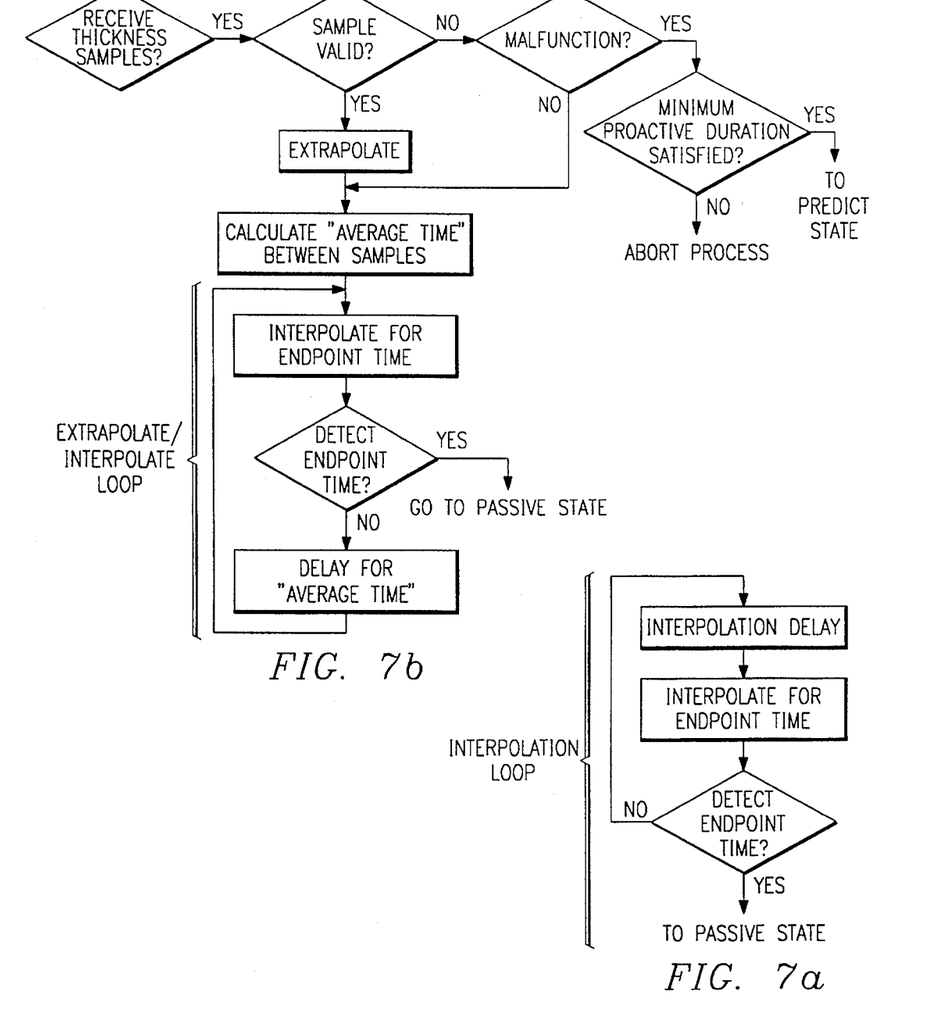
FIGS. 7a and 7b are flow charts of the PROACTIVE state.

The PROACTIVE state begins when the TRANSIENT state ends. During the PROACTIVE state, the actual processing (etch or growth) occurs. Endpoint detector 20 continuously computes a forecasted process rate from the actual thickness measurement samples of the active layer which it receives from processor 16. During the time between samples, detector 20 interpolates and extrapolates for the endpoint time at predetermined time intervals. The PROACTIVE state is discussed in detail below in conjunction with FIG. 7.

The PREDICT state begins when endpoint detector 20 determines that the received thickness measurements are no longer acceptable. The measurements are no longer acceptable when detector 20 determines that there is a malfunction of spectral ellipsometer 12 or processor 16. Typically, such a malfunction is indicated when a predetermined number of consecutive erroneous measurements are received. Detector 20 interpolates for the endpoint time using the forecasted process rate calculated from the last valid thickness sample received before the PREDICT state began. This interpolation continues until the endpoint time is predicted. The PREDICT state is discussed in detail below in conjunction with FIG. 11.

The PASSIVE state begins when endpoint detector 20 signals controller 18 to stop the process to allow for the changing of the process chemistry. The PASSIVE state remains active until controller 18 signals detector 20 that the process has been "turned off". This active period encompasses any overetch period which may be implemented. During the PASSIVE state, detector 20 passively analyzes and records the thickness data samples from processor 16. That is, detector 20 analyzes and records the thickness data, but is no longer empowered to stop or otherwise control the process. The PASSIVE state is discussed in more detail below in conjunction with FIG. 12.

Figure 4:
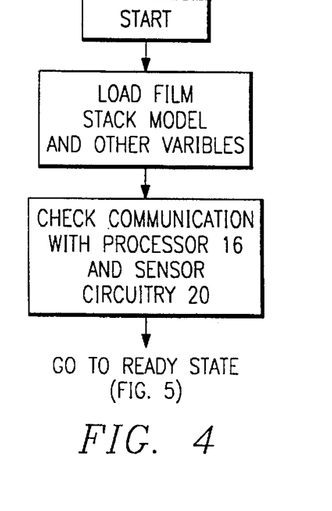
FIG. 4 is a flow chart of the SLEEP state.

Referring to FIG. 4, the SLEEP state is discussed in more detail. First, the FILM STACK MODEL and other variables are loaded into endpoint detector 20 (or associated memory 22 for use by detector 20). TABLE 1 lists these variables and their descriptions.

TABLE 1

| Variable | Variable Description |
| --- | --- |
| 1. FILM STACK MODEL | Describes the number of layers of the wafer and the materials from which they are made. In the case of a etch process, the thickness of each layer before etching is included. |
| 2. TARGET LAYER | The layer where the process endpoint is to occur. |
| 3. TARGET THICKNESS | The desired endpoint thickness of each layer. |
| 4. AFOM | Acceptable figure of merit. |
| 5. MAX TRANSIENT DURATION | The maximum duration between chamber "power on" and the beginning of the process. |
| 6. THRESHOLDS | The threshold rate of change of state or thickness threshold that marks the start of the wafer process (i.e. the chamber process) |
| 7. MIN PROACTIVE DURATION | The minimum process time before entering the PREDICT state. |
| 8. MINRATE | The minimum allowable process rate. |
| 9. MAXRATE | The maximum allowable process rate. |
| 10. FILTER | Selects particular Holt filter or FIR filter or other filters, depending upon the type of process. |

The finite impulse response (FIR) filter, when selected, requires up to ten coefficients which are selected according to the particular process. These coefficients are such that the FIR filter describes the expected process rate versus time. The FIR filter is discussed in detail in conjunction with FIGS. 9A and 10A.

TABLE 2 lists the parameters (with their descriptions) which are loaded into endpoint detector 20 if a Holt filter is selected.

TABLE 2

| Holt Filter Parameters | |
| --- | --- |
| Variable | Variable Description |
| alpha ($\alpha$) | The filter factor for the selected process rate. |
| beta ($\beta$) | Filter factor for trend. |
| gamma ($\gamma$) | Filter factor for deviation. |
| $S_0$ | Initial process rate. |
| $T_0$ | Initial trend. |

TABLE 2-continued

| Holt Filter Parameters | |
| --- | --- |
| Variable | Variable Description |
| $E_0$ | Initial value of relative error per forecasted thickness. |
| $D_0$ | Initial value of absolute error per forecasted thickness. |
| CUTOFF | The cutoff value for identification of outliers. |

The Holt filter will be discussed in detail in conjunction with FIGS. 9B and 10B.

After the variable values are loaded, endpoint detector 20 tests the communication path between it and processor 16 for malfunctions. If the variable values are properly loaded and the communication paths are properly functioning, detector 20 leaves the SLEEP state and enters the READY state. A process model and event trace for the SLEEP state are both included in TABLE 3. This process model and all succeeding process models are written in Communicating Sequential Processes notation. This notation is discussed in detail in C.A.R. Hoare, Communicating Sequential Processes, 1985, Englewood Cliffs, N.J.: Prentice-Hall International, which is hereby incorporated by reference herein for all purposes.

TABLE 3

| SLEEP State |
| --- |
| Process Model |

SLEEP ::
[controller.initializeForEndpoint ? (film_stack_model, controllables)
→ processor.filmStackModel ! film_stack_model
→ processor.startContinuousRegression
→ controller.endpointInitialized ! true
→ READY ]
] ;

| Event Trace | |
| --- | --- |
| Communication Direction | Event |
| controller to endpoint_detector | initializeForEndpoint |
| endpoint_detector to processor | filmStackModel |
| endpoint_detector to processor | startContinuousRegression |
| endpoint_detector to controller | endpointInitialized |

Figure 5:
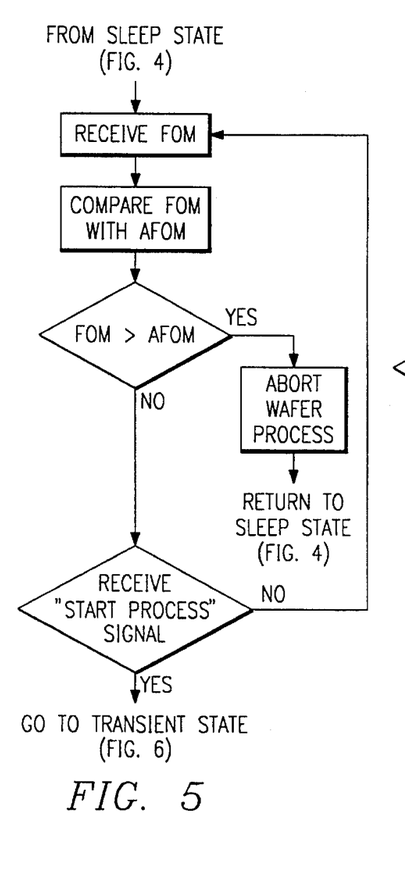
FIG. 5 is a flow chart of the READY state.

FIG. 5 is a detailed flow chart of the READY state. Initially, endpoint detector 20 receives an FOM from processor 16. The FOM is calculated by processor 16 as the aggregate deviation of the RMS error between a theoretically predicted $\psi$ and $\Delta$ graph and an actual $\psi$ and $\Delta$ graph formed at a particular sample time.

It is important to note that the FOM is a real time value which cannot be obtained from LUTs. The method of referenced patent application Ser. No. 07/890,511 can provide an FOM approximately every three seconds, depending upon the speed of processor 16. This is fast enough to allow various components of the presently described endpoint detection system to incorporate the FOM into its calculations.

Detector 12 compares this FOM with the AFOM. The AFOM is a value which has been previously determined to be a threshold FOM. If the FOM is greater than the AFOM, then an improperly positioned wafer 14, relative to ellipsometer 12 and sensor 13, or an erroneously processed wafer layer, or dirty or corroded optics window of spectral ellipsometer 12 is indicated. Endpoint detector 20 signals controller 18 to abort the process. Detector 20 then returns to the SLEEP state.

If the FOM is less than or equal to the AFOM, a properly positioned and properly processed (up to this point) wafer 14 and properly conditioned optics window is indicated. Endpoint detector 20 continues to process subsequent FOMs in this way until one is greater than the AFOM (in which case the process is aborted), or a signal indicating the start of processing is received from controller 18. When this signal is received, detector 20 exits the READY state and enters the TRANSIENT state. A process model and event trace for the READY state are included in TABLE 4.

TABLE 4

READY State

Process Model

READY ::
[ [processor.updatewith ? reportable
    → AnalyzeStaticModel(reportable)
    → READY]
| [ ] [controller.detectEndpoint ? controllables
    → TRANSIENT]
] ;

Event Trace

| Communication Direction | Event |
|---|---|
| spectral_ellipsometer to processor | addData |
| processor to endpoint_detector | updateWith |
| endpoint_detector | AnalyseStaticModel |

It is, however, noted that if no FOM is available, detector 20 can use alternative methods to detect improper wafer 14 placement, improper processing of the existing layers and improper conditions of the optics windows of chamber 10. For example, detector 20 may monitor the layer thicknesses for repeatability. That is, thickness samples of a film not being etched or deposited, for each existing layer, should give repeatable thickness measurements within a predetermined margin of error. If thickness measurements for any layer are not repeatable, detector 20 signals controller 18 to abort the process.

Figure 6:
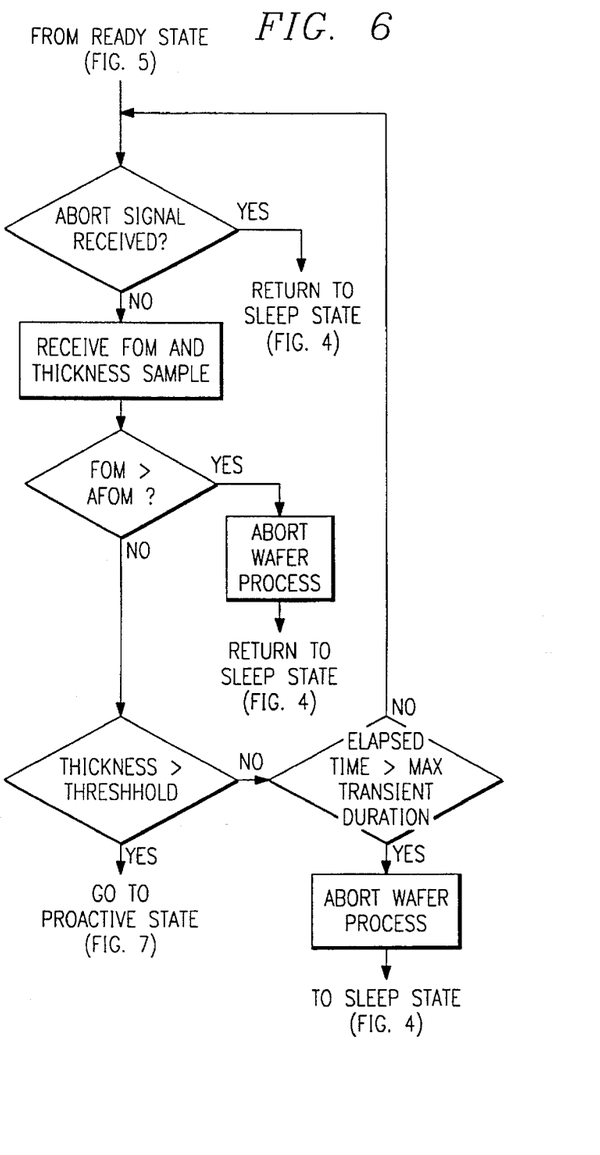
FIG. 6 is a flow chart of the TRANSIENT state.

FIG. 6 is a flow chart detailing the operation of the TRANSIENT state. Detector 20 then determines if a signal from controller 18 has been received which indicates that the chamber 10 process has been aborted. If such a signal has been received, detector 20 returns to the SLEEP state. If the signal has not been received, detector 20 receives an FOM taken at a sample time from processor 16 and compares it with the AFOM. Detector 20 also receives a corresponding actual thickness data sample for each layer of wafer 14, each sample taken at the same sample time.

If the FOM is greater than the AFOM, the thickness samples are invalid. Endpoint detector 20 signals controller 18 to abort the chamber 10 process. If the FOM is less than or equal to the AFOM, the thickness samples are valid. Detector 20 then compares the thickness sample for the top layer to THRESHOLDS, which is described in TABLE 1. If the top layer thickness is less than or equal to THRESHOLDS for a deposition process (greater than or equal to THRESHOLDS for an etch process), detector 20 compares the elapsed time from the entry into the TRANSIENT state to the MAX TRANSIENT DURATION (TABLE 1). If the elapsed time is greater than MAX TRANSIENT DURA- TION, detector 20 signals controller 18 to abort the chamber process, and returns to the SLEEP state. If the elapsed time is less than or equal to MAX TRANSIENT DURATION, detector 20 returns to the beginning of the TRANSIENT state.

If the top layer thickness is greater than THRESHOLD, detector 20 exits the TRANSIENT state and enters the PROACTIVE state. A process model and event trace of the TRANSIENT state appear in TABLE 5.

TABLE 5

TRANSIENT State

Process Model

TRANSIENT ::
[ delay.tenSeconds
    → [ [controller.endpointDetected → exception]
      | [processor.stopRegression → SLEEP ]
    [ ] processor.updateWith ? reportable
      → AnalyzeTransientModel(reportable)
    → [ [ [controller.endpointDetected ! exception]
        | [processor.stopRegression → SLEEP ] ]
      ]
    [ ] TRANSIENT
    [ ] PROACTIVE ]
] ;

Event Trace

| Communication Direction | Event |
|---|---|
| controller to endpoint_detector | detectEndpoint |
| spectral_ellipsometer to processor | addData |
| processor to point_detector | updateWith |
| endpoint_detector | AnalyzeTransientModel |

It is noted that THRESHOLD may be a threshold process rate (the rate of change between consecutive thickness samples for the active layer) instead of a threshold thickness without changing the spirit and scope of the invention.

FIGS. 7A and 7B are detailed flow charts of the PROACTIVE state. FIG. 7A details an interpolation loop, while FIG. 7B details an extrapolation loop. The interpolation and extrapolation loops both run concurrently for the duration of the PROACTIVE state.

Referring to FIG. 7A, detector 20 first executes a predetermined interpolation delay. In one embodiment of the invention, this delay is approximately one second. Detector 20 then interpolates for the endpoint time for the active layer during an interpolation period using a forecasted process rate. The interpolation period is equal to the predetermined delay plus an overlap time. In one embodiment of the invention, the overlap time is approximately half a second.

The forecasted process rate is used to determine the forecasted thickness of the active layer at the end of the interpolation period. If this forecasted thickness is less than (or greater than for an etch process) the desired layer thickness, then the endpoint time is not within the interpolation period, and detector 20 repeats the interpolation loop. If endpoint detector 20 determines the endpoint time is within the interpolation period, it exits the PROACTIVE state and enters the PASSIVE state.

Figure 8:
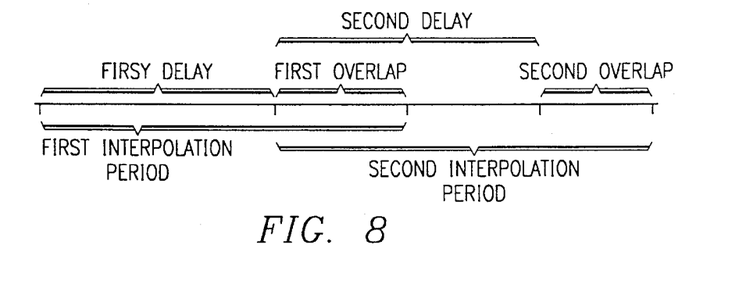
FIG. 8 is a time line of consecutive interpolations.

FIG. 8 illustrates a time line of consecutive interpolations to aid in the explanation of the interpolation process. The overlap time provides endpoint detector 20 with enough time to adequately prepare for the arrival of the endpoint time. For example, if no overlap period were used, the endpoint time might occur within a very short time of an interpolation starting time. Detector 20 may not have enough time to trigger the controller of the endpoint.

Referring to FIG. 7B, when a new FOM and set of thickness data samples have been received, endpoint detector 20 determines if the thickness sample for the active layer is valid. If the sample is invalid, detector 20 determines if ellipsometer 12 or processor 16 has malfunctioned.

If either malfunctions and if the process time since the start of the PROACTIVE state is less than the MIN PROACTIVE DURATION (TABLE 1), then the accumulated process rate is not yet accurate enough to perform an endpoint time detection in the PREDICT state. (MIN PROACTIVE DURATION may be either a predetermined time or a predetermined number of thickness sample sets.) Detector 20 instructs controller 18 to abort the process. If the process time is equal to or greater than MIN PROACTIVE DURATION, detector 20 exits the PROACTIVE state and enters the PREDICT state. The active layer thickness sample validity determination is discussed in detail in conjunction with FIG. 9.

If the sample is invalid but there is no malfunction, the sample is ignored. Detector 20 updates the "average time", which is the average time between consecutive updated FOM and thickness sample set data. Detector 20 simultaneously (to the interpolate loop of FIG. 7A) executes an extrapolate-interpolate loop using "average time" as a delay between interpolations. Detector 20 continues to execute the extrapolate-interpolate loop until either updated values of the FOM and layer thicknesses are received or the endpoint time for the top most layer is detected. If the endpoint time is detected, detector 20 informs the endpoint to the controller and leaves the PROACTIVE state and enters the PASSIVE state.

If the active layer thickness sample is valid, endpoint detector 20 uses this sample to update, i.e. extrapolate the forecasted process rate from the thickness sample time. Detector 20 then calculates "average time" and uses this updated forecasted process rate to perform interpolations in the extrapolation-interpolation loop. (The updated forecasted process rate is also used by the interpolation loop of FIG. 7B.) Extrapolation is discussed in more detail in conjunction with FIGS. 10A and 10B. A process model and event trace of the PROACTIVE state appear in TABLE 7.

The concurrent execution by detector 20 of both the interpolation loop (FIG. 7A) and the extrapolation-interpolation loop (FIG. 7B) provides a fault tolerant system for detecting the endpoint time of the active layer. Whichever loop detects the endpoint time first "wins". That is, when it detects endpoint, each loop has the power, independently of the other loop, to instruct detector 20 to enter the PASSIVE state.

The fault tolerant aspect of the present invention allows the system accuracy to be independent from the "average time". For example, if the "average time" became 0.5 seconds, then the interpolation loop, with an interpolation time of 1 second, will only look for endpoint approximately every other thickness sample. However, the extrapolation-interpolation loop will perform an interpolation approximately every sample. Thus, the extrapolation-interpolation insures that an interpolation will occur at least every sample, while the interpolation loop sets the maximum time between interpolations approximately equal to the interpolation delay.

It is noted that if a process change is not required between consecutive layers, detector 20 may remain in the PROACTIVE state until a process change is required. That is, the only endpoint time which requires detection is that corresponding to the last active layer before a process change. This capability speeds up the wafer processing time because the process in chamber 10 is stopped only when necessary.

TABLE 7

PROACTIVE State

Process Model

PROACTIVE ::
[ [ [ delay.oneSecond
 → InterpolateEndpoint(film_stack_model) ]
[ ] [ processor.updateWith ? Reportable
 → ExtrapolateEndpoint(reportable) ] ]
 → [PROACTIVE
 [ ]PREDICT
 [ ] [controller.endpointDetected ! true
 → PASSIVE ] ]
];

Event Trace

| Communication Direction | Event |
|---|---|
| spectral_ellipsometer to processor | addData |
| sensor processor to endpoint_detector | updateWith |
| endpoint_detector | ExtrapolateEndpoint |
| endpoint_detector | InterpolateEndpoint |
| endpoint_detector | InterpolateEndpoint |
| endpoint_detector | InterpolateEndpoint |
| spectral_ellipsometer to processor | addData |
| processor to endpoint_detector | updateWith |
| endpoint_detector | ExtrapolateEndpoint |

Figures 9, 9A, 9B:
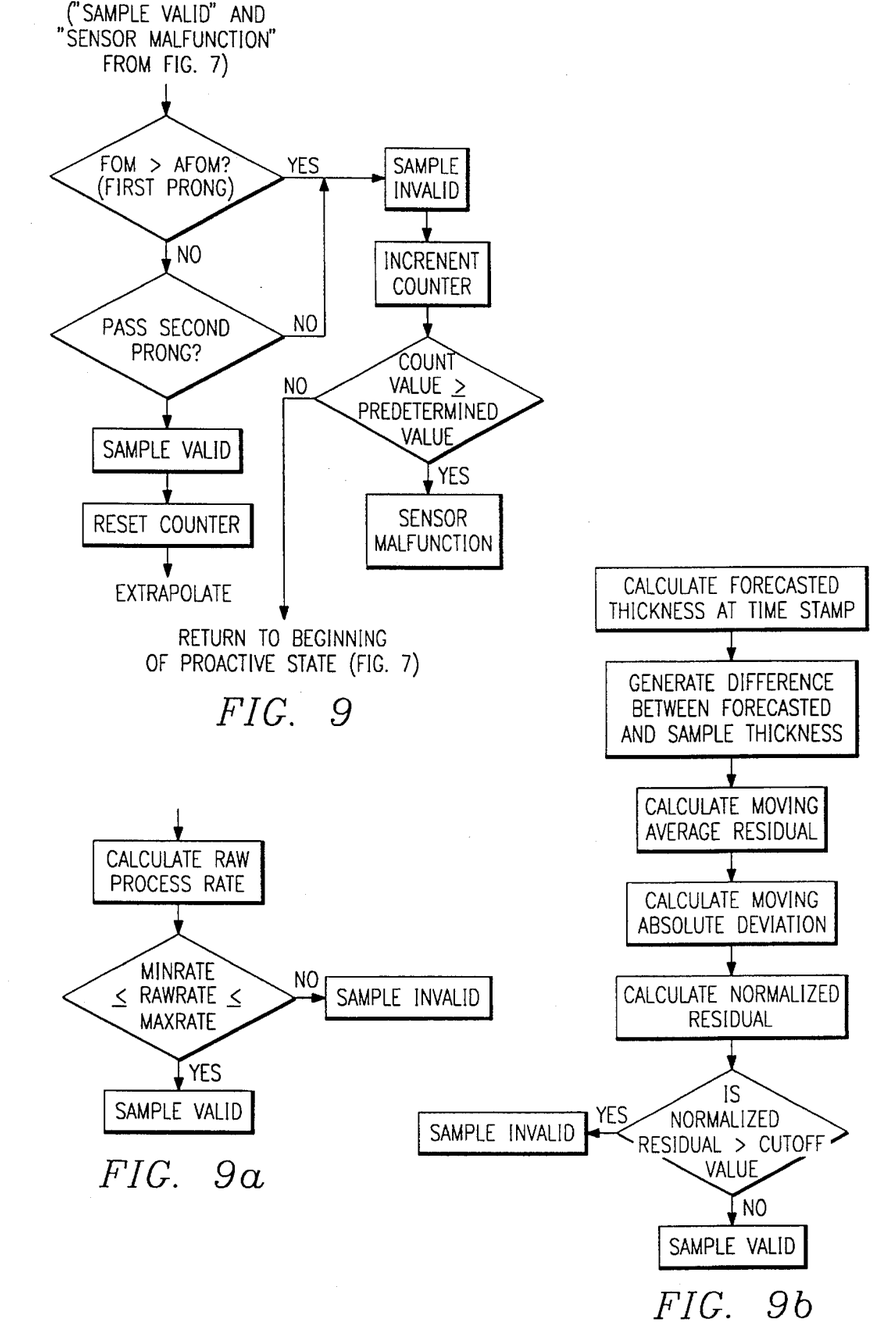
FIG. 9 is a flow chart of the thickness data invalidity determination of FIG. 7b that determines the existence of the "Sample Valid" and "Sensor Malfunction" conditions.
FIG. 9a is a flow chart of the second prong of the "Sample Valid" test of FIG. 7b for an FIR filter implementation.
FIG. 9b is a flow chart of the second prong of the "Sample Valid" test for a Holt filter implementation.

FIG. 9 is a flow chart which details the thickness data sample validity determination of FIG. 7B. In the described embodiment of the present invention, only the active layer thickness sample is analyzed for validity, since only this sample is used to update the forecasted process rate. However, other embodiments may determine the validities of the thickness samples for other layers (which should remain constant after they are processed). Invalidity of these other samples can indicate malfunctioning of ellipsometer 12 or processor 16.

In one embodiment of the present invention, the validity determination consists of a two prong test. For the first prong, endpoint detector 20 compares the FOM to the AFOM. If the FOM is greater than the AFOM, the active layer thickness sample, hereinafter "thickness sample", is determined invalid. It is not required that this invalid thickness sample be subjected to the second prong of the test. If the FOM is less than or equal to the AFOM, the thickness sample is subjected to the second prong of the test.

FIG. 9A is a flow chart illustrating the second prong of the validity test for an FIR filter implementation. First, the raw process rate is calculated according to the following equation:

$$X_i = \left| \frac{A_i - A_{i-1}}{t_i - t_{i-1}} \right| \quad (1)$$

where $t_i$ is the time stamp corresponding to the thickness sample $A_i$, $t_{i-1}$ is the prior time stamp, $X_i$ is the raw process rate at $t_i$, and $A_{i-1}$ is the most recent prior thickness sample. If $X_i$ falls between the MAX RATE and MIN RATE process rates (TABLE 1), then the thickness sample $A_i$ passes the second prong of the test and is determined valid. If $X_i$ is greater than MAX RATE or less than the MIN RATE, $A_i$ fails the second prong of the test and is determined to be invalid. MIN RATE and MAX RATE test can be used in conjunction with Holt filter method. The Holt and FIR filter methods can also be used in conjuction with one another.

FIG. 9B is a flow chart of the second prong of the test for a Holt filter implementation. Before the forecasted process rate is extrapolated, the prior forecasted rate is used to predict the active layer thickness at the sample time indicated by the time stamp. This prediction is formed and stored in memory 22 according to the following equation:

$$B_i = B_{i-1} - (F_{i-1} * (t_i - t_{i-1})) \quad (2)$$

where $t_i$ is the time stamp, $t_{i-1}$ is the prior time stamp, $B_i$ is the predicted active layer thickness at $t_i$, $B_{i-1}$ is the predicted active layer thickness at $t_{i-1}$, $F_{i-1}$ is the prior forecasted process rate extrapolated at $t_{i-1}$, and $t_i - t_{i-1}$ is the elapsed time between the thickness data sample and the prior thickness data sample.

The difference, i.e. residual error, between $B_i$ and the thickness data sample, i.e., actual thickness, is calculated and stored in memory 22 according to the equation:

$$e_i = A_i - B_i \quad (3)$$

where $e_i$ is the residual error and $A_i$ is the actual active layer thickness at $t_i$.

The moving average residual is then calculated and stored in memory 22 according to the equation:

$$E_i = (1-\gamma)e_i + \gamma E_{i-1} \quad (4)$$

where $E_i$ is the moving average residual at $t_i$, $\gamma$ is a filter factor which can vary from zero to one and $E_{i-1}$ is the moving average residual at $t_{i-1}$.

Next, the moving absolute deviation is calculated and stored in memory 22 according to the equation:

$$D_i = (1-\gamma)|e_i| + \gamma D_{i-1} \quad (5)$$

where $D_i$ is the moving absolute deviation at $t_i$ and $D_{i-1}$ is the moving absolute deviation at $t_{i-1}$, The normalized residual is then calculated according to the equation:

$$nr_i = \left| \frac{e_i - E_{i-1}}{D_{i-1}} \right| \quad (6)$$

where $nr_i$ is the normalized residual at $t_i$. $nr_i$ is compared to a predetermined cutoff value CUTOFF (TABLE 2). If $nr_i$ is greater than CUTOFF, the actual active layer thickness data sample $A_i$ is invalid. Otherwise, $A_i$ is valid.

Referring again to FIG. 9, if thickness sample $A_i$ is determined invalid, a counter is incremented. If the counter value reaches a predetermined value, typically two or three, detector 20 determines ellipsometer 12 or processor 16 has malfunctioned. If $A_i$ is invalid but the counter has not reached its predetermined value, detector 20 ignores $A_i$, i.e., does not use $A_i$ to update the forecasted process rate. Only when $A_i$ is valid does detector 20 perform the updating process. The counter is reset to zero whenever a valid $A_i$ is received.

The above described validity determination allows a random invalid thickness sample to be discarded or replaced with a corrected value. Thus, the extrapolation process can continue with subsequent valid samples, without being corrupted by invalid samples. If a predetermined number of consecutive invalid samples occur, endpoint detector 20 realizes a malfunction has occurred. Thus, it saves processing resources by not even testing subsequent thickness samples for validity. Detector 20 assumes all such subsequent samples are invalid.

Figure 10A:
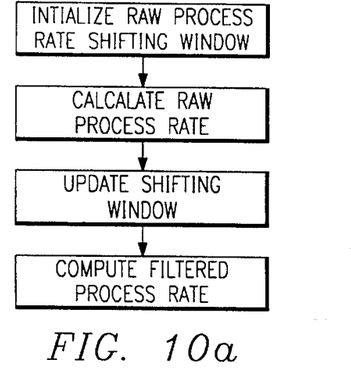
FIG. 10a is a flow chart of the extrapolation process of FIG. 7b using an FIR filter implementation.
Figure 10B:
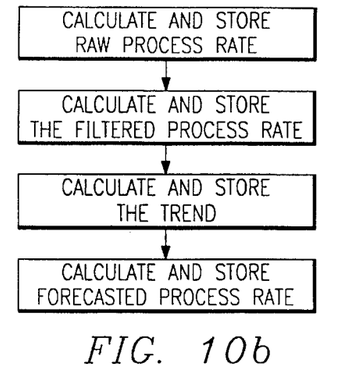
FIG. 10b is a flow chart of the extrapolation process of FIG. 7b using a Holt filter implementation.

FIGS. 10A–B are flow charts detailing the extrapolation process. FIG. 10A details one extrapolation process using a finite impulse response (FIR) filter for nonlinear process rates. FIG. 10b details one extrapolation process using a Holt filter for process rates which are approximately or exactly linear.

Referring to FIG. 10A, an FIR filter includes an array of n coefficients $a_1 \ldots a_n$. (These coefficients are loaded into endpoint detector 20 during the SLEEP state as discussed above.) An N length "shifting window" is initialized with an initial raw etch rate $X_O$. The shifting window contains raw process rates $X_{i-n+j}$ for j from 1 to n. The shifting window is initialized according to the equation:

$$X_{i-n+1} = X_{i-n+2} = \ldots = X_{i-1} = X_i \quad (7)$$

Thereafter, the shifting window will contain the n most recently calculated raw process rates $X_n$. In one embodiment, n=10.

When a valid thickness sample $A_i$ is received, endpoint detector 20 calculates the raw process rate $X_i$. If the process is an etch process, the raw etch rate is calculated according to the equation:

$$X_i = \frac{A_{i-1} - A_i}{t_i - t_{i-1}} \quad (8)$$

where $X_i$ is the raw etch rate at $t_i$.

If the process is a growth, i.e. deposition process, the raw deposition rate is calculated according to the equation:

$$X_i = \frac{A_i - A_{i-1}}{t_i - t_{i-1}} \quad (9)$$

where $X_i$ is the raw growth rate at $t_i$. Once the raw process rate $X_i$ is calculated, the $X_i$ position of the shifting window is updated with the value of $X_i$ and the window values are shifted by one. For example, the value in window position $X_{1-n+3}$ is shifted to position $X_{1-n+2}$. The filtered process rate is then calculated according to the equation:

$$S_i = \sum_{j=1}^{n} \alpha_j X_{i-n+j} \quad (10)$$

where $S_i$ is the filtered process rate at $t_i$.

The forecasted process rate is calculated according to the equation:

$$F_i = S_i \quad (11)$$

where $F_i$ is the forecasted process rate which is valid from $t_i$ to $t_{i+1}$ (the time stamp of the next valid thickness data sample).

Referring to FIG. 10B, a Holt filter is described. Typically, a Holt filter is more accurate than an FIR filter when the process rate is linear. The following discussion will be based on a linear etch process with a linear trend (such as a plasma etch process), although it is also applicable to a linear growth process having a linear trend.

The raw etch rate is first calculated and stored in memory 22 according to the equation:

$$X_i = \frac{A_{i-1} - A_i}{t_i - t_{i-1}} \quad (12)$$

where the description of each variable is the same as discussed above in conjunction with the FIR filter.

The filtered etch rate is calculated and stored in memory 22 according to the equation:

$$S_i = (1-\alpha)X_i + \alpha F_i \quad (13)$$

where $\alpha$ is a filter factor which can vary from zero to one ($\alpha$ was previously loaded into detector 20 during the SLEEP state as discussed above).

The trend is next calculated and stored in memory 22 according to the equation:

$$T_i = (1-\beta)(S_i - S_{i-1}) + \beta T_{i-1} \quad (14)$$

where $T_i$ is the trend at $t_i$ and $\beta$ is a second filter factor which can vary from zero to one ($\beta$ is loaded into detector 20 during the SLEEP state).

The forecasted etch rate is calculated according to the following equation:

$$F_i = S_i + T_i \qquad (15)$$

where $F_i$ is valid from $t_i$ to $t_{i+1}$.

Figure 11:
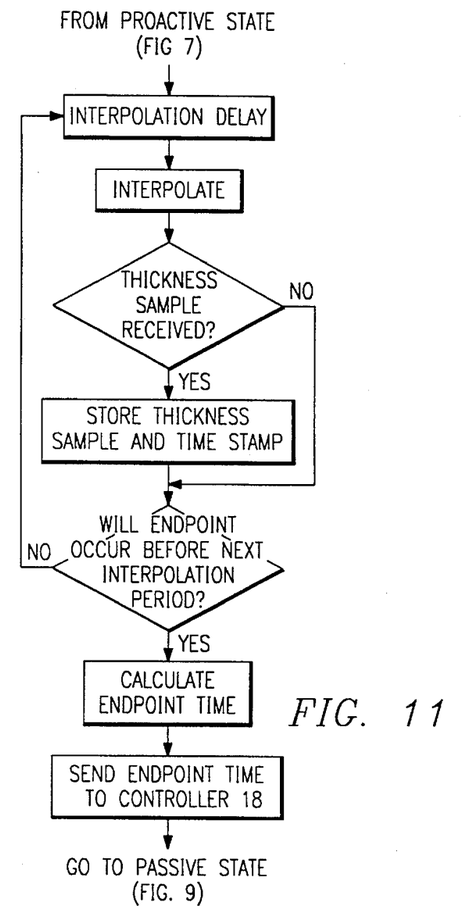
FIG. 11 is a flow chart of the PREDICT state process of the present embodiment.

FIG. 11 is a flow chart detailing the operation of the PREDICT state. First, endpoint detector 20 delays a predetermined amount of time and performs an interpolation as described above in conjunction with FIG. 7A. Next, if a new thickness data sample has been received, detector 20 saves the sample and its time stamp in memory 22.

Detector 22 then determines if the endpoint will occur during the interpolation period. If not, detector 20 loops back to the beginning of the PREDICT state. If the endpoint will so occur, detector 20 calculates the endpoint time.

If an FIR filter is used, the endpoint time is calculated according to the following equation:

$$\text{time to endpoint} = \frac{A_i - (S_i * t_i) - \text{target}}{S_i} \qquad (16)$$

where "target" is the desired thickness for the layer currently under process, i.e., the active layer. This equation gives the endpoint time referenced to $t_i$. For example, if the above equation gives a time of ten seconds, the endpoint will occur ten seconds after $t_i$.

If a Holt filter is used, the endpoint time is calculated according to the equation:

$$\text{time to endpoint} = \frac{B_i - (S_i * t_i) - \text{target}}{F_i} \qquad (17)$$

where the endpoint time is also referenced to $t_i$.

Once the endpoint time has been calculated, it is sent to process controller 16. Detector 20 then exits the PREDICT state and enters the PASSIVE state. A process model and event trace for the PREDICT state appear in TABLE 8.

TABLE 8

PREDICT State

Process Model

PREDICT ::
[ delay.oneSecond
→ InterpolateEndpoint(film_stack_model)
→ [ [ controller.endpointDetected ! true
→ PASSIVE]
[ ] PREDICT ]
[ ] processor.updateWith ? reportable
→ SynchronizeWithTimeStamp(reportable)
→ PREDICT
] ;

Event Trace

| Communication Direction | Event |
|---|---|
| spectral_ellipsometer to processor | addData |
| processor to endpoint_detector | updateWith |
| endpoint_detector | SynchronizeWithTimeStamp |
| endpoint_detector | InterpolateEndpoint |
| endpoint_detector | InterpolateEndpoint |
| spectral_ellipsometer to processor | addData |
| processor to endpoint_detector | updateWith |
| endpoint_detector | SynchronizeWithTimeStamp |

Figure 12:
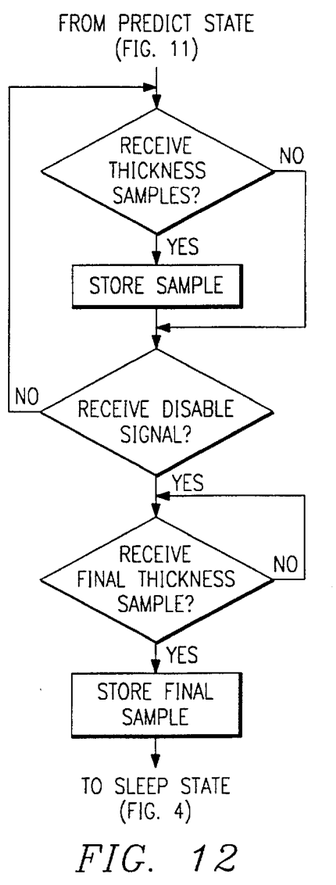
FIG. 12 is a flow chart of the PASSIVE state process of the present embodiment.

FIG. 12 is a flow chart detailing the operation of the PASSIVE state. Endpoint detector 20 stores any thickness data samples provided by the processor 16 in memory 22. Next, detector 20 determines if a disable signal has been received from controller 18. The disable signal indicates that the chamber 10 process has stopped. If the disable signal has not been received, detector 20 loops back to the beginning of the PASSIVE state, and continues to receive and store thickness data samples.

When the disable signal is received, endpoint detector 20 waits until a final set of thickness data samples have been provided by the processor. This final sample set is stored in memory 22. Detector 20 then exits the PASSIVE state and returns to the SLEEP state. A process model and event trace of the PASSIVE state appear in TABLE 9.

TABLE 9

PASSIVE State

Process Model

PASSIVE ::
[ processor.updateWith ? reportable
→ TraceSample(reportable)
→ PASSIVE
[ ] controller.disable
→[ [ processor.updateWith ? reportable
→ GetFinalStaticSample ]
| [ processor.stopRegression → SLEEP ] ]
].

Event Trace

| Communication Direction | Event |
|---|---|
| endpoint_detector to chamber process_control | endpointDetected |
| spectral_ellipsometer to processor | addData |
| processor to endpoint_detector | updateWith |
| endpoint_detector | TraceSample |
| process control to endpoint_detector | disable |
| endpoint_detector to processor | stopRegression |
| spectral_ellipsometer to processor | addData |
| processor to endpoint_detector | updateWith |
| endpoint_detector | GetFinalStaticSample |

Although the present invention and its advantages have been described in detail, it should be understood that various changes, substitutions and alterations can be made therein without departing from the spirit and scope of the invention as defined by the appended claims. For example, for systems that do not generate an FOM or any alternative FOM metrics during the process (i.e., some LUT systems), the second prong of the validity test alone may be used. Also, in real time systems receiving an FOM, the first prong alone may be implemented to save processing time.

Furthermore, any suitable process rate filter can be used in place of the FIR or Holt filter. The detection of invalid thickness samples can be delayed until the process is stabilized.

The occurence of conditions other than thickness sample invalidity can be used to transition from the PROACTIVE state to the PREDICT state. Such conditions may be a predetermined thickness change in the active layer or when the thickness of the active layer reaches a predetermined value. Transitions on the occurence of such conditions may be appropriate where data gathered over a number of processes indicates that after a certain thickness change or after a certain thickness of the active layer has been reached, the thickness samples regularly become unreliable.

What is claimed is:

1. A method for predicting an endpoint time of a semiconductor process at which a thickness of a target layer of a wafer occurs, the method comprising the steps of:

receiving an actual thickness sample of the layer calculated at a first sample time;

determining whether or not the thickness sample is valid;

updating a forecasted process rate using the thickness sample if the thickness sample is valid;

predicting the endpoint time from the forecasted process rate; and controlling the process to generate the layer having the desired thickness.

2. The method of claim 1 wherein the step of determining comprises the steps of:

receiving a figure of merit calculated at the first sample time;

comparing the figure of merit to an acceptable figure of merit;

determining that the thickness sample is valid if the figure of merit is less than or equal to the acceptable figure of merit.

3. The method of claim 1 wherein the step of determining comprises the steps of:

calculating a predicted layer thickness at the first sample time from a prior forecasted process rate calculated at a prior sample time;

generating a difference between the predicted layer thickness and the thickness sample;

determining from the difference a moving average residual at the first sample time;

calculating from the difference a moving absolute deviation at the first sample time;

calculating a normalized residual from the difference, a prior moving average residual and a prior moving absolute deviation, wherein both the prior moving average residual and the prior moving absolute deviation are calculated for the prior sample time;

comparing the normalized residual to a predetermined cutoff; and determining the thickness sample is within the predetermined range if the normalized residual is less than or equal to the cutoff.

4. The method of claim 1 wherein the step of determining comprises the steps of:

calculating a raw process rate;

comparing the raw process rate to minimum and maximum process rates; and determining that the thickness sample is within the predetermined range if the raw process rate is between the minimum and maximum process rates.

5. The method of claim 1 wherein the step of predicting further comprises the steps of:

determining whether the endpoint time will occur within a predetermined interpolation time from the first sample time; and predicting the endpoint time if the endpoint time will occur within said predetermined interpolation time.

6. A method for predicting an endpoint time of a semiconductor process at which a thickness of a target layer of a wafer occurs, the semiconductor process occurring in a chamber, the method comprising the steps of:

receiving an actual thickness sample of the thickness of the layer and a figure of merit calculated for a first sample time;

determining from the figure of merit whether the actual thickness sample is valid;

updating a forecasted process rate using the actual thickness sample if the actual thickness sample is valid; and predicting the endpoint time from the forecasted process rate.

7. The method of claim 6 wherein the step of determining comprises the steps of:

comparing the figure of merit to an acceptable figure of merit;

determining that the actual thickness sample is valid if the figure of merit is less than or equal to the acceptable figure of merit.

8. The method of claim 6 wherein the step of determining comprises the steps of:

comparing the figure of merit to an acceptable figure of merit;

determining that the actual thickness sample is valid if the figure of merit is greater than the acceptable figure of merit;

if the figure of merit is less than or equal to the acceptable figure of merit, calculating a predicted thickness sample of the layer at the first sample time from a prior forecasted process rate calculated at a prior sample time;

calculating a difference between the predicted thickness sample and the actual thickness sample;

calculating from the difference a moving average residual at the first sample time;

calculating from the difference a moving absolute deviation at the first sample time;

calculating a normalized residual from the difference, a prior moving average residual and a prior moving absolute deviation, wherein both the prior moving average residual and the prior moving absolute deviation are calculated for the prior sample time;

comparing the normalized residual to a cutoff; and determining the actual thickness sample is valid if the normalized residual is less than or equal to the cutoff.

9. The method of claim 6 wherein the step of determining comprises the steps of:

comparing the figure of merit to an acceptable figure of merit;

determining that the actual thickness sample is invalid if the figure of merit is greater than the acceptable figure of merit; if the figure of merit is less than or equal to the acceptable figure of merit, calculating a raw process rate;

comparing the raw process rate to a minimum process rate and a maximum process rate; and determining the actual thickness sample is valid if the raw process rate is between the minimum and the maximum process rates.

10. The method of claim 6 further comprising the steps of:

receiving a prior figure of merit calculated for a prior sample time occurring before the process has started;

comparing the prior figure of merit to an acceptable figure of merit;

determining the wafer meets preprocessing tolerances if the prior figure of merit is less than or equal to the acceptable figure of merit.

11. The method of claim 6 further comprising the steps of:

receiving a prior figure of merit calculated for a prior sample time occurring before the process has started;

comparing the prior figure of merit to an acceptable figure of merit;

determining the wafer is properly positioned in the chamber if the prior figure of merit is less than or equal to the acceptable figure of merit.

12. A method for predicting an endpoint time at which a thickness of a target layer of a wafer under process occurs, comprising the steps of:

receiving an actual layer thickness sample of the layer calculated for a first sample time;

determining if the actual layer thickness sample is valid using Holt's method;

updating a forecasted process rate with the actual layer thickness sample using a Holt filter if the actual layer thickness sample is valid;

predicting the endpoint time from the forecasted process rate; and controlling the process, using the endpoint time, to produce the layer at the desired thickness.

13. The method of claim 12 wherein the step of determining comprises the steps of:

calculating a predicted layer thickness sample at the first sample time from a prior forecasted process rate calculated at a prior sample time;

calculating a difference between the predicted layer thickness sample and the actual layer thickness sample;

calculating a moving average residual, at the first sample time, from the difference;

calculating a moving absolute deviation, at the first sample time, from the difference;

calculating a normalized residual from the difference, a prior moving average residual and a prior moving absolute deviation, wherein both the prior moving average residual and the prior moving absolute deviation are calculated for the prior sample time;

comparing the normalized residual to a cutoff;

determining the actual layer thickness sample is valid if the normalized residual is less than or equal to the cutoff.

14. The method of claim 12 wherein the step of updating the forecasted process rate comprises the steps of:

calculating a raw process rate;

calculating a filtered process rate from the raw process rate and a prior forecasted process rate;

calculating a process rate trend from the filtered process rate; and setting the forecasted process rate equal to a sum of the filtered process rate and the process rate trend.

15. The method of claim 12 further comprising the step of setting the filtered process rate equal to an initial process rate before the process begins.

16. The method of claim 12 wherein the steps of updating and predicting comprise the steps of:

calculating a raw process rate;

calculating a filtered process rate from the raw process rate and a prior forecasted process rate;

calculating a process rate trend from the filtered process rate;

setting the forecasted process rate equal to a sum of the filtered process rate and the process rate trend;

calculating a predicted layer thickness sample at the first sample time;

conjugating the filtered process rate with the first sample time to generate a conjugation;

generating a first difference between the predicted layer thickness sample and the conjugation;

generating a second difference between the first difference and the predetermined thickness; and dividing the second difference by the forecasted process rate to generate the endpoint time.

17. A method for predicting an endpoint time at which a desired thickness of a target layer of a wafer under process occurs, comprising the steps of:

receiving an actual layer thickness calculated by a processor for a first sample time;

calculating a raw process rate;

comparing the raw process rate to a minimum process rate and a maximum process rate;

determining the actual layer thickness is valid if the raw process rate is between the minimum and the maximum process rates;

updating a forecasted process rate with the actual layer thickness if the actual layer thickness is valid;

predicting the endpoint time from the forecasted process rate; and controlling the process, using the endpoint time, to produce the layer at the desired thickness.

18. The method of claim 17 wherein the step of updating comprises the steps of:

updating a shifting window with the raw process rate;

computing the forecasted process rate from the shifting window.

19. The method of claim 17 wherein the step of predicting comprises the steps of:

generating a conjugation between the forecasted process rate and the first sample time;

computing a first difference between the actual layer thickness and the conjugation;

generating a second difference between the first difference and the desired thickness; and dividing the second difference by the forecasted process rate to obtain the endpoint time.

20. A system for controlling a semiconductor process for a wafer within a process chamber and having at least one layer, the system comprising:

a generator for generating and transmitting a source signal, having a first set of parameters, toward the wafer and for receiving a reflected signal, having a second set of parameters, from the wafer;

a processor in communication with the generator for calculating for a first sample time an actual layer thickness and a figure of merit from a set of differences between the first and second sets of parameters;

an endpoint detector in communication with the processor for using the figure of merit to determine if the actual layer thickness is within a predetermined range, for updating a forecasted process rate from the actual layer thickness if the actual layer thickness is within the predetermined range and for predicting an endpoint time from the forecasted process rate; and a controller in communication with the process chamber and the endpoint detector, the controller responsive to the endpoint time for generating control signals for controlling the semiconductor process.

21. The system of claim 20 further comprising the endpoint detector for:

comparing the figure of merit to an acceptable figure of merit;

determining that the actual layer thickness is outside of the predetermined range if the figure of merit is greater than the acceptable figure of merit;

if the figure of merit is less than or equal to the acceptable figure of merit,
- calculating a predicted layer thickness at the first sample time from a prior forecasted process rate calculated at a prior sample time;
- calculating a difference between the predicted layer thickness and the actual layer thickness;
- calculating from the difference a moving average residual at the first sample time;
- calculating from the difference a moving absolute deviation at the first sample time;
- calculating a normalized residual from the difference, a prior moving average residual and a prior moving absolute deviation, wherein both the prior moving average residual and the prior moving absolute deviation are calculated for the prior sample time;
- comparing the normalized residual to a predetermined cutoff; and
- determining the actual layer thickness is within the predetermined range if the normalized residual is less than or equal to the predetermined cutoff.

22. The system of claim 20 comprising the endpoint detector for
- comparing the figure of merit to an acceptable figure of merit;
- determining that the actual layer thickness is outside of the predetermined range if the figure of merit is greater than the acceptable figure of merit;

if the figure of merit is less than or equal to the acceptable figure of merit,
- calculating a raw process rate;
- comparing the raw process rate to a minimum process rate and a maximum process rate; and
- determining the actual layer thickness is within the predetermined range if the raw process rate is between the minimum and the maximum process rates.

23. The system of claim 20 comprising the endpoint detector for
- determining whether the endpoint time will occur within a predetermined interpolation time from the first sample time; and
- predicting the endpoint time if the endpoint time will occur within the predetermined interpolation time.

24. The system of claim 20 further comprising the endpoint detector for
- comparing the figure of merit to an acceptable figure of merit; and
- determining that the actual layer thickness is outside of the predetermined range of the figure of merit is greater than the acceptable figure of merit.

* * * * *